United States Patent
Chuang et al.

(10) Patent No.: US 9,425,206 B2
(45) Date of Patent: Aug. 23, 2016

(54) BOUNDARY SCHEME FOR EMBEDDED POLY-SION CMOS OR NVM IN HKMG CMOS TECHNOLOGY

(71) Applicant: Taiwan Semiconductor Manufacturing Co., Ltd., Hsin-Chu (TW)

(72) Inventors: Harry-Hak-Lay Chuang, Zhubei (TW); Wei Cheng Wu, Zhubei (TW); Ya-Chen Kao, Fuxing Township (TW); Shih-Chang Liu, Alian Township (TW); Fang-Lan Chu, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/580,454

(22) Filed: Dec. 23, 2014

(65) Prior Publication Data

US 2016/0181268 A1 Jun. 23, 2016

(51) Int. Cl.
  *H01L 23/48* (2006.01)
  *H01L 23/52* (2006.01)
  *H01L 29/40* (2006.01)
  *H01L 27/115* (2006.01)

(52) U.S. Cl.
  CPC ... *H01L 27/11573* (2013.01); *H01L 27/11526* (2013.01)

(58) Field of Classification Search
  USPC ....... 257/314, 401, 192, 369, 288, 295, 351, 257/371; 438/283, 591, 592, 294, 400, 216, 438/151, 154, 163, 218, 221, 296, 424, 585, 438/587, 593; 365/185.17, 158, 163
  See application file for complete search history.

(56) References Cited

U.S. PATENT DOCUMENTS

| | | | |
|---|---|---|---|
| 6,221,734 B1 | 4/2001 | Lin | |
| 8,524,556 B1* | 9/2013 | Chiou | H01L 27/0629 257/380 |
| 2003/0057505 A1* | 3/2003 | Ebina | H01L 27/105 257/411 |
| 2006/0006492 A1* | 1/2006 | Shimizu | H01L 21/76229 257/506 |
| 2006/0240221 A1 | 10/2006 | Ramarajan | |
| 2010/0255647 A1* | 10/2010 | Yamakoshi | H01L 27/11546 438/211 |
| 2015/0187783 A1* | 7/2015 | Chuang | H01L 21/28273 257/314 |
| 2015/0333082 A1* | 11/2015 | Chuang | H01L 27/11573 257/326 |
| 2016/0013198 A1* | 1/2016 | Liu | H01L 27/11524 257/322 |

* cited by examiner

*Primary Examiner* — Dao H Nguyen
*Assistant Examiner* — Tram H Nguyen
(74) *Attorney, Agent, or Firm* — Eschweiler & Associates, LLC (57) ABSTRACT

The present disclosure relates to a structure and method for reducing CMP dishing in integrated circuits. In some embodiments, the structure has a semiconductor substrate with an embedded memory region and a periphery region. one or more dummy structures are formed between the memory region and the periphery region. Placement of the dummy structures between the embedded memory region and the periphery region causes the surface of a deposition layer therebetween to become more planar after being polished without resulting in a dishing effect. The reduced recess reduces metal residue formation and thus leakage and shorting of current due to metal residue. Further, less dishing will reduce the polysilicon loss of active devices. In some embodiments, one of the dummy structures is formed with an angled sidewall which eliminates the need for a boundary cut etch process.

19 Claims, 9 Drawing Sheets

BOUNDARY SCHEME FOR EMBEDDED POLY-SION CMOS OR NVM IN HKMG CMOS TECHNOLOGY

BACKGROUND

Over the last few decades, the semiconductor industry has improved performance and power consumption by continually reducing, or scaling, the size of integrated chip components according to Moore's Law. However, in recent years scaling has become more difficult and alternative technologies have been used to improve integrated chip performance. One such technology is the use of embedded memory. Embedded memory is non-stand-alone memory, which is integrated on a same chip as a logic core, and that supports the logic core to accomplish an intended function. High-performance embedded memory is a key component in VLSI because of its high-speed and wide bus-width capability, which eliminates inter-chip communication. Another such technology is the replacement of typically polysilicon gate electrodes with metal gate electrodes to improve device performance with the decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations).

In an attempt to reduce cost while still improving device performance, a direction taken by the semiconductor industry has been the integration of logic devices and memory devices on an embedded system sharing a same semiconductor chip. This integration improves performance over solutions where two separate chips—one for memory and another for logic—cause undesirable delays through wires or leads that connect the two chips. Such embedded systems may use high-k metal gate transistors. High-k metal gate (HKMG) technology has become one of the front-runners for the next generation of CMOS devices and an integrated HKMG circuit provides an improved performance and reduced leakage along with the above mentioned advantages.

A traditional method of fabricating an embedded system having a HKMG integrated circuit involves two etching processes: a first boundary cut etching process which involves removal of sacrificial polysilicon from a boundary region (a region between an embedded memory and a periphery/logic circuit) and a second HKMG polysilicon etching process which completes formation of the HKMG transistor stacks in the periphery/logic circuit by removing sacrificial polysilicon from gate regions of the HKMG transistors. After formation of the HKMG transistor stacks, a dielectric material is deposited and a chemical mechanical polishing (CMP) process is performed to remove excess material from a surface of the substrate.

These two etching processes result in the formation of a deep recess in the semiconductor substrate within the boundary region. This recess leads to accumulation of metal in the boundary region after metal gate deposition in the periphery circuit. The metal residue collected in the boundary region in turn may create high leakage current and/or an electrical short between the embedded memory and the periphery/logic circuit when contact metal interconnects are formed over it. Furthermore, during the CMP process, material may be undesirably removed from some regions. In an embedded memory structure, so called "CMP dishing" can aggravate the accumulation of metal residue and further result in undesirable removal of polysilicon from transistors or devices on an array edge or near the boundary region, which effects the proper functioning of the devices.

Accordingly, the present disclosure relates to a new structure and processing method, which utilizes one or more dummy structures on either side of the boundary region that help in the formation of a deposition layer having a more even surface profile. In some embodiments, the structure comprises a semiconductor substrate having an embedded memory region and a periphery region. A non-volatile memory (NVM) or a poly SiON (Silicon oxy-nitride) CMOS is device disposed over the embedded memory region, and a periphery circuit having a high-k metal gate transistor is disposed over the periphery region. One or more dummy structures are laterally disposed between the embedded memory region and the periphery region. Placement of the dummy structures between the embedded memory region and the periphery region causes the surface of a deposition layer (e.g., a dielectric layer) therebetween to become more planar after being planarized without resulting in a dishing effect, thereby mitigating electrical shorts due to metal residue. Further, less dishing will reduce the polysilicon loss of devices near to the boundary region.

Figure 1:
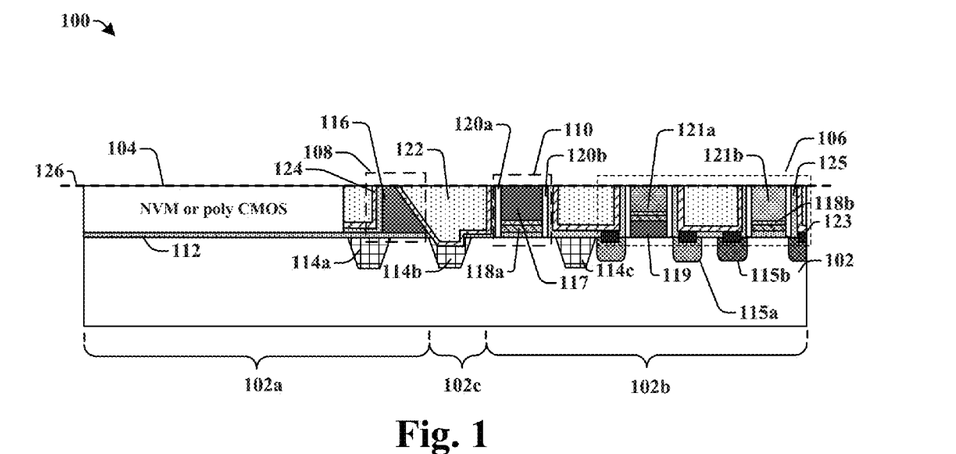
FIG. 1 illustrates a cross-sectional view of an integrated circuit with one or more dummy structures, according to some embodiments of the present disclosure.

FIG. 1 illustrates a cross-sectional view of an integrated circuit 100 with one or more dummy structures, according to some embodiments of the present disclosure.

Integrated circuit 100 resides on a semiconductor substrate 102 (e.g., a silicon substrate, and SOI substrate, etc.), which has a first region 102a and second region 102b laterally separated by a boundary region 102c. A base dielectric layer 112 is disposed onto the semiconductor substrate 102 and vertically separates an overlying NVM or poly CMOS circuit 104 from the semiconductor substrate 102. STI regions 114a, 114b and 114c, and source/drain regions represented by 115a (n doped) and 115b (p doped) are present within the semiconductor substrate 102.

The NVM or poly CMOS circuit 104, comprising a non-volatile memory (NVM) device or a poly SiON (silicon oxy-nitride) CMOS device respectively, resides over the first region 102a and a HKMG periphery circuit 106 resides over the second region 102b. Dummy structures, 108 and/or 110, are disposed on one or more sides of the boundary region 102c. Dummy structures, 108 and/or 110, are structurally identical to an active device, but not electrically active (i.e., dummy structures do not contribute to the functionality of the integrated circuit 100).

For example, as shown in FIG. 1, a first dummy structure 108 and a second dummy structure 110 reside on opposing sides of the boundary region 102c. In some embodiments, the first dummy structure 108 may comprise an angled sidewall, while the second dummy structure 110 comprises vertical sidewalls. In some embodiments, the first dummy structure 108 comprises a polysilicon layer 116 over the base dielectric layer 112, whereas the second dummy structure 110 comprises a high-k dielectric layer 118a over the base dielectric layer 112 and an etch-stop layer 118b over the high-k dielectric layer 118a and polysilicon layer 117 over the etch-stop layer 118b. In other embodiments, the second dummy structure 110 may comprise a metal gate disposed over the etch-stop layer 118b. In some embodiments, sidewall spacers, 120a and 120b, are disposed on either side of the dummy structures, 108 and 110. For example, as shown in FIG. 1, sidewall spacers 120a and 120b are disposed on both sides of the second dummy structure 110.

The second region 102b comprises one or more HKMG transistors having metal gates 121a (n-metal) and 121b (p-metal) residing over gate dielectric layers 119 and 112, respectively. In some embodiments, gate dielectric layer 119 is a HV (high voltage) oxide, which makes that transistor a HV HKMG transistor. The HV oxide has a larger thickness than the base dielectric layer 112. A first inter-layer dielectric (ILD) material 122 is disposed laterally between the different devices. In some embodiments, a silicide region 123 is disposed over the source/drain regions and a contact etch-stop layer (CESL) 124 resides over top surface of the semiconductor substrate 102 as well as sidewalls of devices. A dielectric layer 125 laterally fills in the space between different devices. In some embodiments, the dielectric layer 125 and the sidewall spacers 120a and 120b comprise silicon oxy-nitride (SiON), silicon dioxide ($SiO_2$), or silicon nitride (SiN), for example.

Reference numeral 126 represents a horizontal plane along which a chemical mechanical polishing (CMP) process is performed during fabrication of the integrated circuit 100 (e.g., before and after metal gate replacement in the second region 102b). The location of the dummy structures, 108 and 110, around the boundary region 102c prevents dishing of the first ILD material 122 within the boundary region 102c, thereby preventing metal from being deposited along a top surface of the first ILD material 122 and electrical shorting between the first region 102a and the second region 102b.

Figure 2:
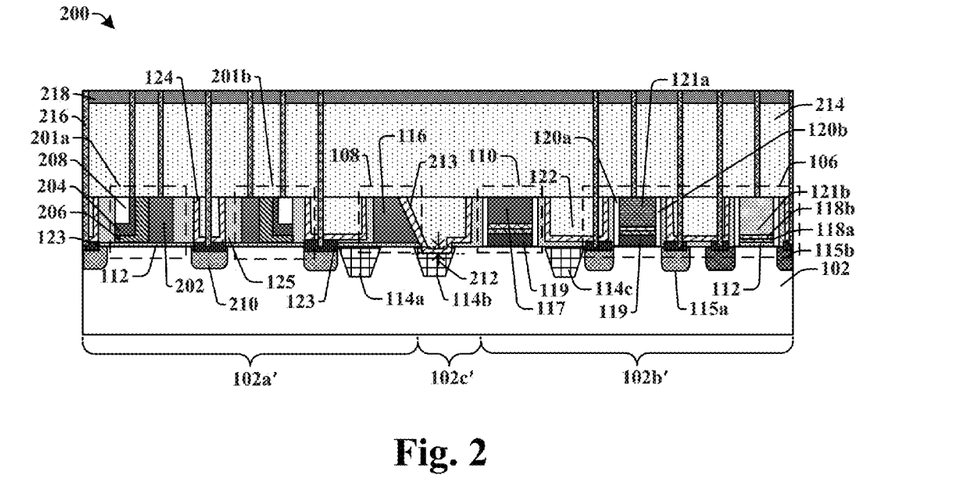
FIG. 2 illustrates a detailed cross-sectional view of an integrated circuit with two dummy structures, according to some embodiments of the present disclosure.

FIG. 2 illustrates a more detailed cross-sectional view of an integrated circuit 200 with two dummy structures, according to some embodiments of the present disclosure. As shown in FIG. 2, the memory region 102a' comprises a pair of split gate flash memory cells 201a and 201b, where each split gate memory cell comprises a select gate (SG) 202, a memory gate (MG) 204 and a charge trapping layer 206, where the charge trapping layer 206 separates SG 202 from MG 204 and extends under the MG 204. A sidewall spacer 208 abuts an outer sidewall of the MG 204 and a plurality of source/drain regions 210 are disposed within the substrate in the memory region 102a'.

Boundary region 102c' comprises the STI region 114b, which is recessed to a depth 212 in comparison with a top surface of the semiconductor substrate 102 in the memory region 102a' and periphery region 102b'. In some embodiments, the first dummy structure 108 has an angled sidewall 213 facing the boundary region 102c' and a substantially vertical sidewall opposing the angled sidewall 213. A second ILD layer 214 is disposed over the semiconductor substrate above the devices. Finally, metal contacts 216 extend from an overlying metal interconnect layer (not shown) into silicide regions 123 disposed within source/drain regions, 115 and 210, and to top surfaces of the gate structures (e.g., 121a, 121b, 202, and 204). In some embodiments, a protective barrier layer 218 may be disposed over the second ILD layer 214.

As will be appreciated in greater detail below, the first dummy structure 108 and the second dummy structure 110 will add structure to the integrated circuit 200 that reduces an area that is prone to dishing during CMP processes. The shape of the angled side wall 213 of the first dummy structure 108 will further aid in removal of the HKMG residue from the boundary region 102c' during the HKMG/polysilicon etching process, and save an additional boundary cut process which helps reduce processing cost. Since the depth 212 of the STI recess is small, there is less metal gate residue in the boundary region 102c' and less electrical leakage and shorting problems associated with metal residue. The smaller depth 212 of the STI recess also reduces CMP dishing, so the active devices of the NVM or poly CMOS circuit 104 and the periphery circuit 106 are saved from polysilicon loss.

Figure 3:
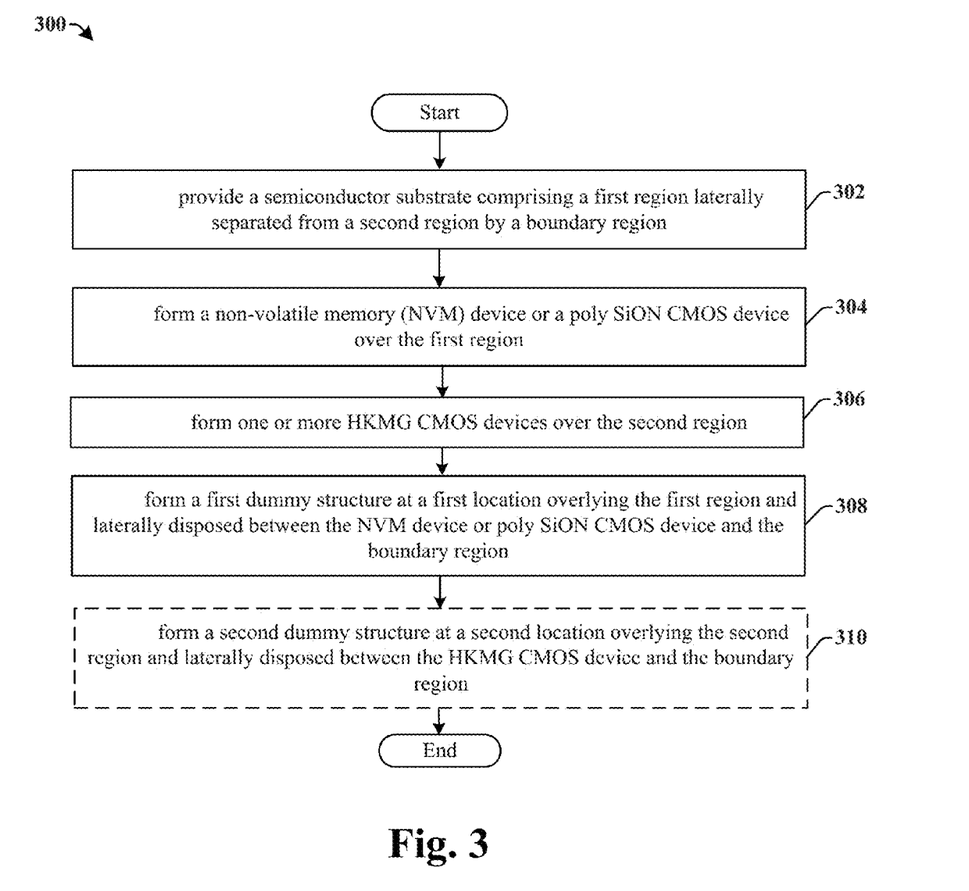
FIG. 3 illustrates a flow diagram of some embodiments of a method for forming an integrated circuit according to the present disclosure.

FIG. 3 illustrates a flow diagram of a method 300 of some embodiments of a method for forming an integrated circuit according to the present disclosure. While disclosed method 300 and other methods (e.g., method 400) illustrated herein are described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a semiconductor substrate is provided, comprising a first region laterally separated from a second region by a boundary region.

At 304, a NVM device or a poly SiON CMOS device is formed over the first region.

At 306, one or more HKMG CMOS devices are formed over the second region.

At 308, a first dummy structure is formed at a first location, overlying the first region and laterally disposed between the boundary region and the NVM device or the poly SiON CMOS device.

At 310, a second dummy structure is formed at a second location overlying the second region and laterally disposed between the one or more HKMG CMOS devices and the boundary region.

Figure 4:
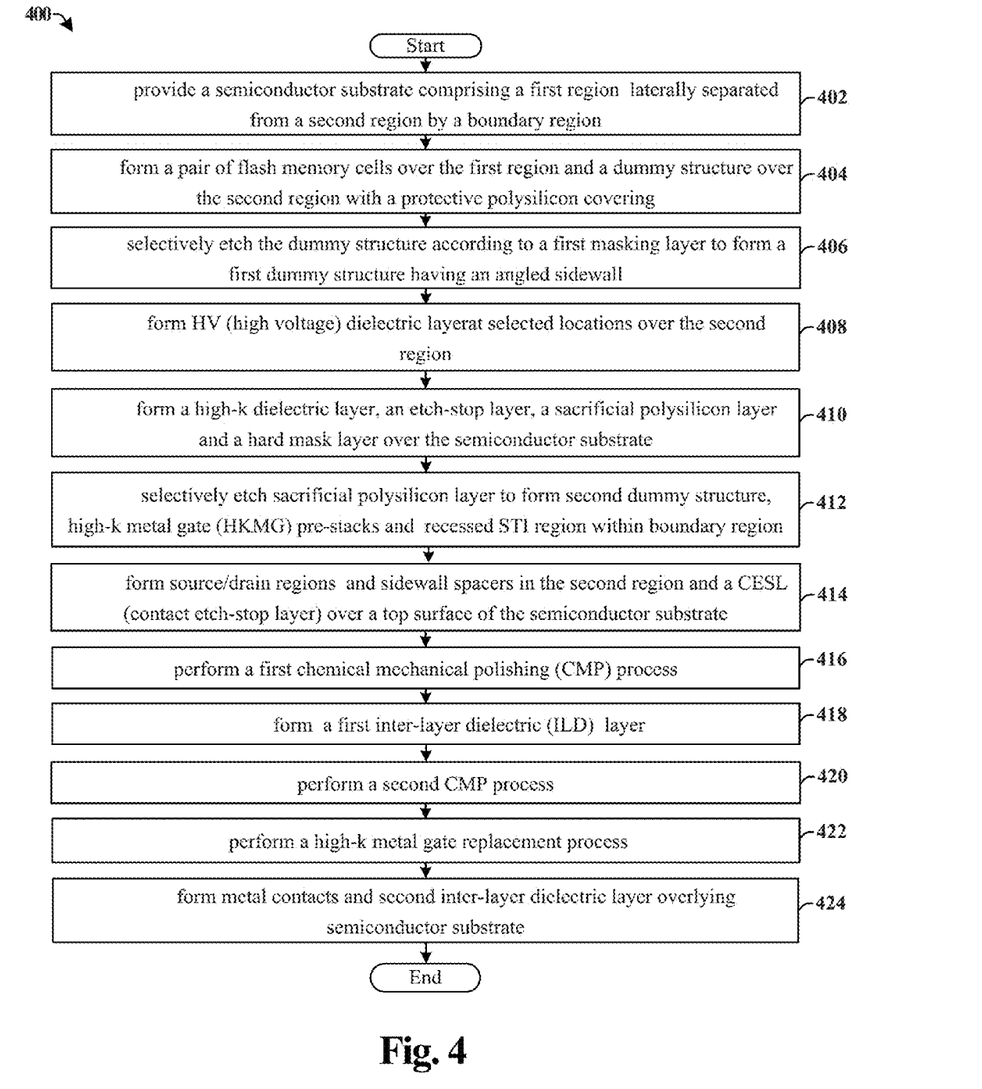
FIG. 4 illustrates a detailed flow diagram of some embodiments of a method for forming an integrated circuit according to the present disclosure.

FIG. 4 illustrates a more detailed flow diagram of a method 400 of some embodiments of a method for forming an integrated circuit according to the present disclosure.

At 402, a semiconductor substrate is provided, that comprises a first region laterally separated from the second region by a boundary region. The boundary region comprises a recessed STI region.

At 404, a pair of split gate flash memory cells is formed over the first region and a dummy structure is formed over the second region with a protective polysilicon covering.

At 406, the dummy structure is selectively etched according to a first masking layer, to form a first dummy structure. In some embodiments, the first dummy structure may have an angled sidewall.

At 408, a HV dielectric layer is formed at selected locations over the second region.

At 410, a high-k compound layer, a sacrificial polysilicon layer and a hard mask layer are formed over the semiconductor substrate. The high-k compound layer comprises a high-k dielectric layer and a metal etch-stop layer.

At 412, the sacrificial polysilicon layer is selectively etched to form a second dummy structure, HKMG pre-stacks, and a recessed STI region within the boundary region.

At 414, source/drain regions and sidewall spacers are formed in the second region and a CESL layer is formed over a top surface of the semiconductor substrate.

At 416, a first chemical mechanical polishing (CMP) process is performed. The first and second dummy structures prevent the first CMP process from dishing in the boundary region.

At 418, a first inter-layer dielectric (ILD) layer is formed.

At 420, a second CMP process is performed. The first and second dummy structures prevent the second CMP process from dishing in the boundary region.

At 422, a high-k metal gate replacement process is performed. The HKMG process replaces sacrificial polysilicon on the HKMG pre-stacks with a metal gate material.

At 424, a second ILD layer and metal contacts are formed over the semiconductor substrate.

FIGS. 5-17 illustrate embodiments of cross-sectional images corresponding to a method of forming an integrated circuit with two dummy structures, according to some embodiments of the present disclosure. It will be appreciated that although these cross-sectional views illustrate a pair of split-gate memory cells, in typical embodiments an integrated circuit will include thousands, millions, billions, or even greater numbers of such split-gate memory cells arranged in a memory array. The integrated circuit also includes peripheral circuitry that can utilize different process layers (e.g., HKMG and/or replacement metal gate technology), such as are used in CMOS processes.

Figure 5:
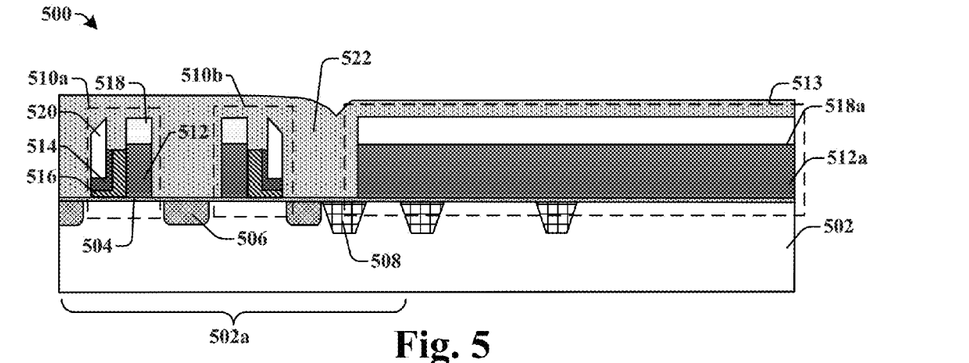
FIGS. 5-17 illustrate embodiments of cross-sectional images of a step by step method of formation of an integrated circuit with two dummy structures, according to some embodiments of the present disclosure.

FIG. 5 illustrates a cross-sectional view of a semiconductor body 500, corresponding to acts 402-404.

The semiconductor body 500 includes a semiconductor substrate 502 which memory devices and peripheral devices (e.g., CMOS devices) are formed. In some embodiments, the semiconductor substrate 502 can be a bulk silicon substrate, a silicon-on-insulator (SOI) substrate, a binary semiconductor substrate (e.g., GaAs), a tertiary semiconductor substrate (e.g., AlGaAs), or a higher order semiconductor substrate, for example. Any of these substrates can include doped regions formed in the substrate, one or more insulating layers formed in or on the substrate, and/or conducting layers formed in or on the substrate.

A pair of split-gate flash memory cells, 510a and 510b, is formed over a memory region 502a. In some embodiments, each one of the pair of split-gate flash of the memory cells, 510a and 510b, comprises a SG 512, a MG 514, a charge-trapping layer 516 which extends below the MG 514, a sidewall spacer 520 which abuts an outer sidewall of the MG 514 and spacer material cap 518 over a top surface of the SG 512. In some embodiments, the MG 514 can have a square or rectangle shape, rather than an 'L' shape, as illustrated in this embodiment. A base dielectric layer 504, such as an oxide layer, a nitride layer, silicon oxy-nitride (SiON) layer, or a high-k gate dielectric, resides on top of the semiconductor substrate 502 and can help protect the semiconductor body during future etching steps. STI regions 508 are disposed within the semiconductor substrate 502. Further, source/drain regions 506 are formed within the semiconductor substrate 502, for example, by ion implantation or out-diffusion of dopants. Parts the SG 512 and the spacer material cap 518, 512a and 518a, extend over a region of the semiconductor substrate 502 to form a dummy structure 513. A protective polysilicon covering 522 is formed over the semiconductor substrate 502, covering the split-gate flash memory cells 510a, 510b and the dummy structure 513.

Figure 6:
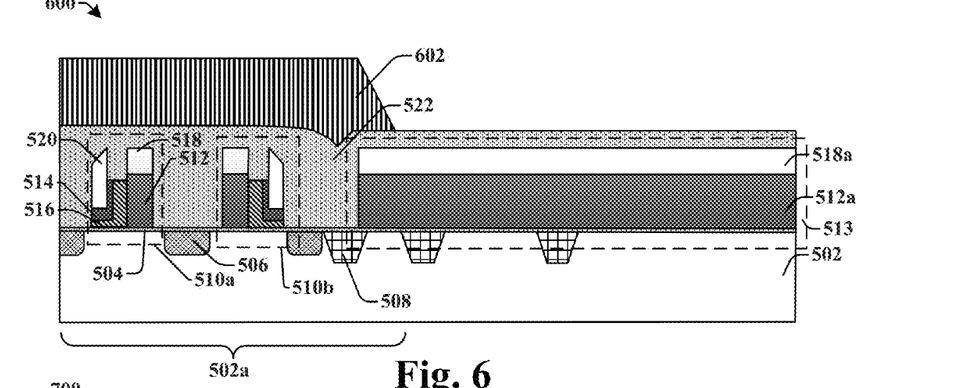
Figure 7:
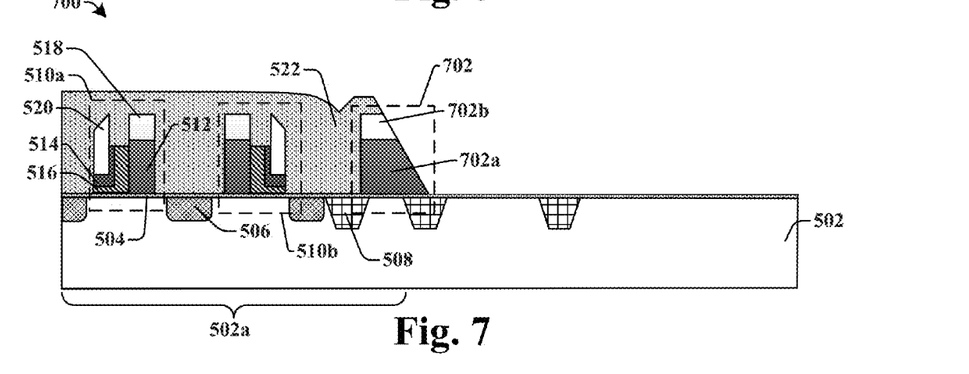

FIGS. 6-7 illustrate cross-sectional images of semiconductor bodies, 600 and 700, corresponding to act 406.

As shown by semiconductor body 600, a hard mask 602 is formed over the semiconductor substrate 502. The hard mask 602 defines the shape and width of the first dummy structure that is subsequently formed. As shown by semiconductor body 700, the dummy structure 513 is etched to form a first dummy structure 702, which is what remains of the dummy structure 513 after an etching process with hard mask 602. The first dummy structure 702 comprises a dielectric layer 702b (e.g., SiON) overlying a polysilicon layer 702a. In various embodiments, the dummy structure 513 may be etched using a dry etchant (e.g., an RIE etch, a plasma etch, etc.) or a wet etchant (e.g., hydroflouric acid).

Figure 8:
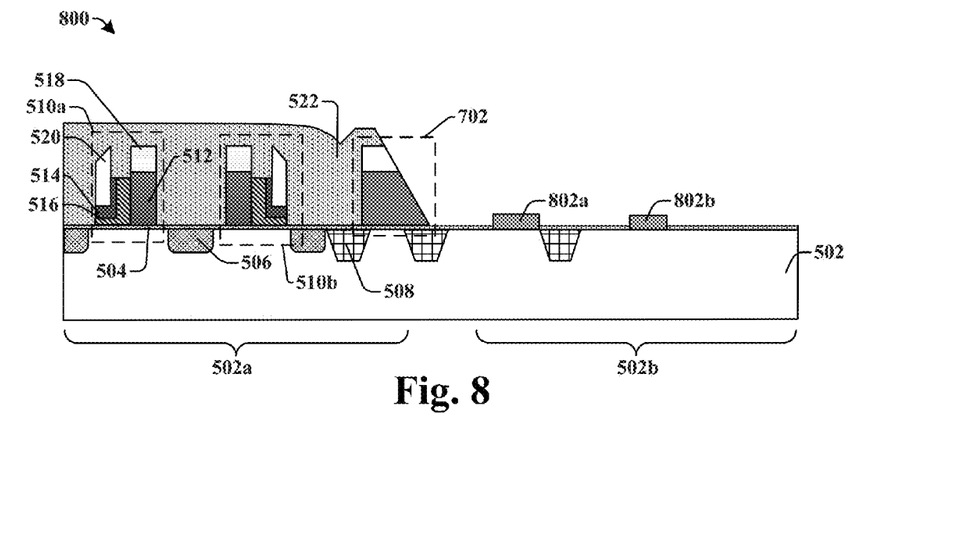

FIG. 8 illustrates a cross-sectional view of a semiconductor body 800 corresponding to act 408. As shown in semiconductor body 800, HV dielectric layers 802a and 802b are formed over a periphery region 502b of the semiconductor substrate 502. In some embodiments, the HV dielectric layer 802a and 802b are formed by selectively patterning and etching a HTO (high temperature oxide) layer formed by exposing the substrate to an elevated temperature (e.g., approximately 1000° C.) during a furnace oxidation process. In some embodiments, a wet etching process is performed to define the locations of HV dielectric layers 802a and 802b, while in other embodiments a dry etching process may be used. The thickness of the HV dielectric layers 802a and 802b is between approximately 80 angstroms and 200 angstroms, being approximately 180 Angstroms in some embodiments.

Figure 9:
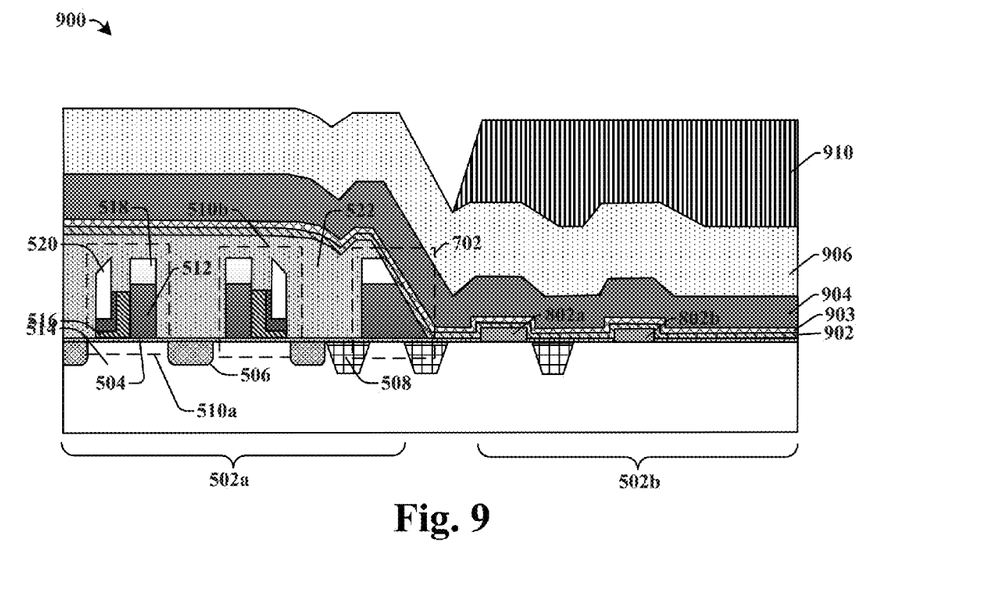

FIG. 9 illustrates a cross-sectional view of a semiconductor body 900 corresponding to act 410. As shown in semiconductor body 900, a high-k dielectric layer 902, an etch-stop layer (ESL) 903, a sacrificial polysilicon layer 904 and a hard mask layer 906, are deposited over the semiconductor substrate 502. In some embodiments, the high-k dielectric layer comprises HfO (hafnium oxide), HfSiO (hafnium silicon oxide), HfAlO (hafnium aluminum oxide), or HfTaO (hafnium tantalum oxide). The ESL is usually a metal layer which acts as a stopping layer during polysilicon etching in later stages of processing. Further, a masking layer 910 defines the area which is etched in future acts. In some embodiments, the high-k dielectric layer 902, the ESL 903, the sacrificial polysilicon layer 904 and the hard mask layer 906 may be formed using a vapor deposition technique (e.g., PVD, CVD, PE-CVD, etc.).

FIGS. 10-13 illustrate cross-sectional views of semiconductor bodies, 1000, 1100, and 1200, corresponding to act 412.

Figure 10:
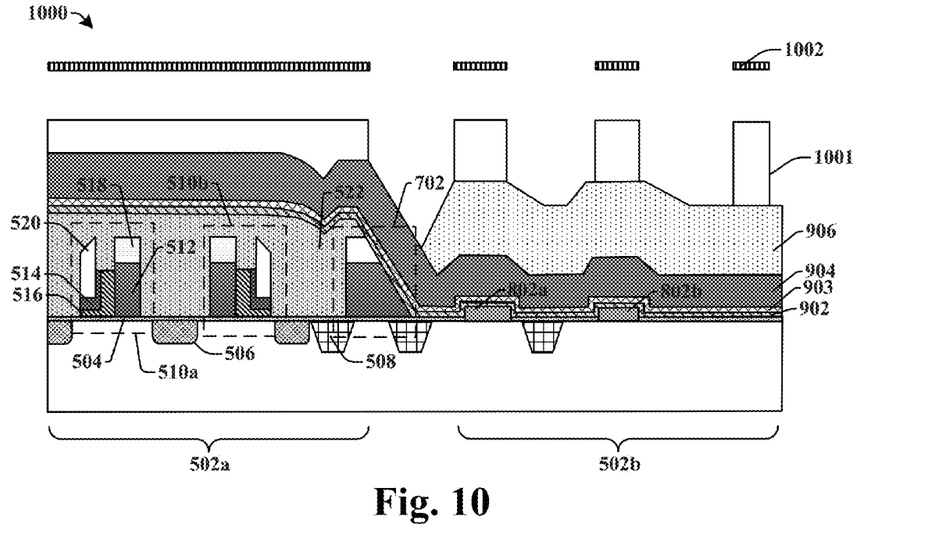

As shown in semiconductor body 1000, the hard mask layer 906 is selectively etched. In some embodiments, the hard mask layer 906 may be etched using a photolithography process. For example, a first photo mask 1002 is used to pattern a first photoresist layer 1001, which is subsequently used to pattern the underlying layers in an etching process. In various embodiments, the hard mask layer 906 may be selectively etched using a dry etchant or a wet etchant.

Figure 11:
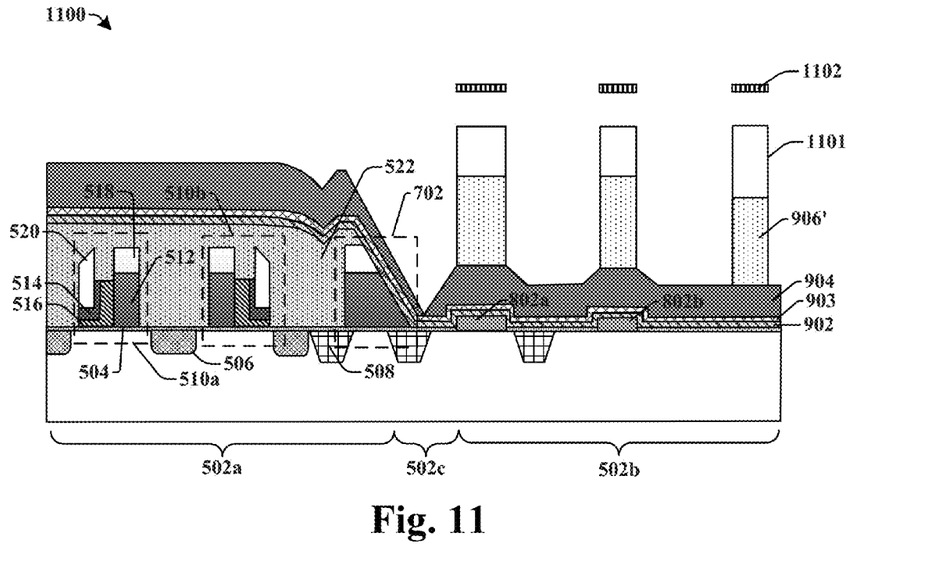

As shown by semiconductor body 1100, the hardmask layer 906 is selectively etched to form portions of gate stacks 906', and to remove portions of the sacrificial polysilicon layer 904 from the boundary region 502c. In some embodiments, removal of the sacrificial polysilicon layer 904 from the boundary region 502c forms an angled surface, that allows for HKMG residue to be easily removed in future etching steps. In some embodiments, a second photoresist layer 1101 and a second photomask 1102 are used to define regions for the etching process. In other embodiments, the patterned hardmask layer 906' may be used to pattern the underlying sacrificial polysilicon layer 904. In various embodiments, the sacrificial polysilicon layer 904 is selectively etched using a dry etchant or a wet etchant.

Figure 12:
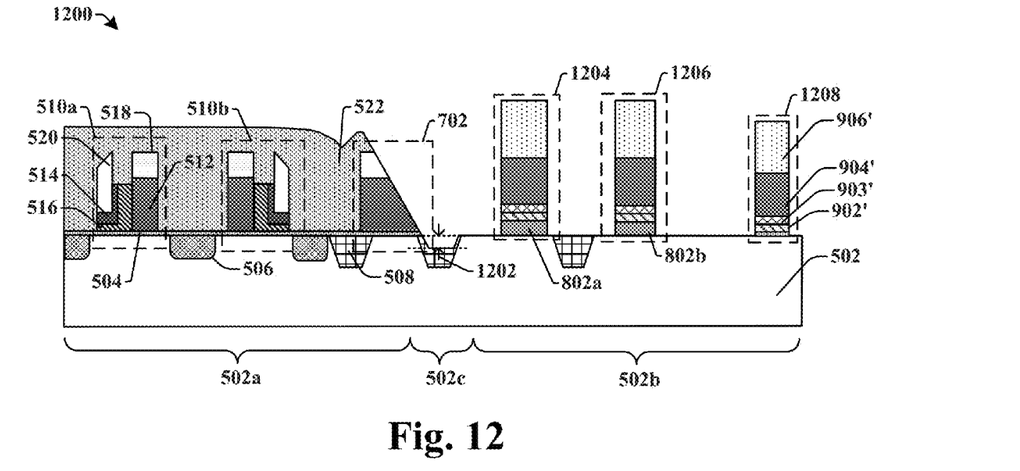

As shown by semiconductor body 1200, the HKMG device layers are patterned according to the second photomask 1102 (shown in FIG. 11) to form a second dummy structure 1204, a HV HKMG transistor 1206 and a regular HKMG transistor 1208. Each HKMG transistor comprises a patterned high-k dielectric layer 902', a patterned etch-stop layer 903', a patterned sacrificial polysilicon layer 904' and a patterned hardmask layer 906'. HKMG residue is removed from the boundary region 502c in this etching step and a small recess 1202 is formed in the STI region 508 in the boundary region 502c. The depth 1202 of the recess ranges between approximately 0 Angstroms and approximately 200 Angstroms. The angled sidewall of the first dummy structure and this etching step eliminates the use of an additional boundary cut process, and therefore helps in reducing processing costs.

Figure 13:
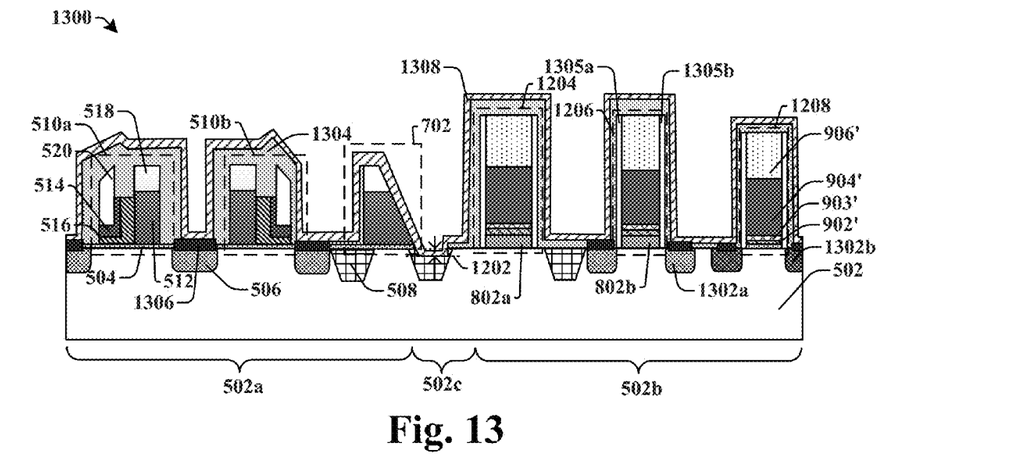

FIG. 13 illustrates a cross-sectional view of a semiconductor body 1300 corresponding to act 414. As shown by semiconductor body 1300, the protective polysilicon covering 522 is removed from the memory region 502a, source/drain regions 1302a (e.g., by way of an n-type implantation) and 1302b (e.g., by way of a p-type implantation) are formed in the periphery region 502b, sidewall spacers 1305a and 1305b are formed on either side of the HKMG stacks, a dielectric layer 1304 is formed surrounding the split-gate memory devices and the HKMG stacks, a silicide layer 1306 is formed over the source/drain regions, and a CESL layer 1308 is formed to encompass the split-gate memory devices, the dummy structures and the HKMG stacks.

Figure 14:
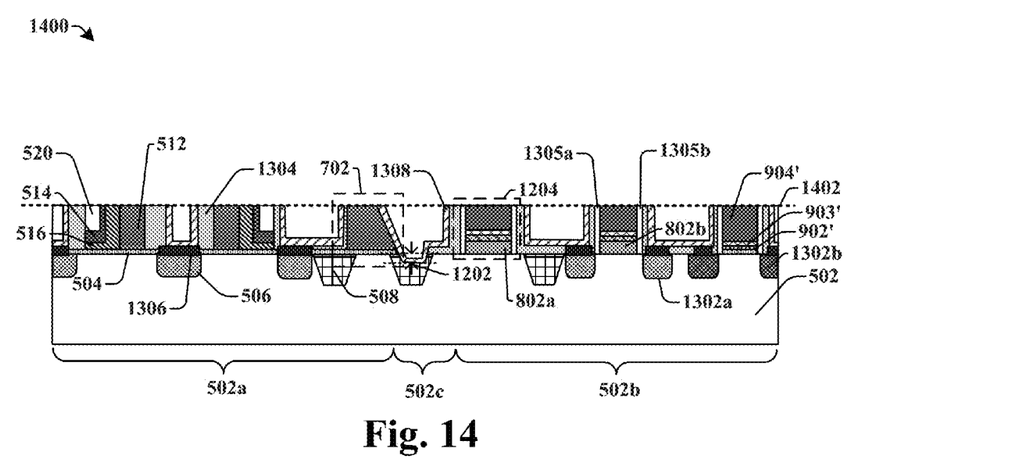

FIG. 14 illustrates a cross-sectional view of a semiconductor body 1400 corresponding to act 416. As shown by semiconductor body 1400, a first chemical mechanical polishing (CMP) process is performed along horizontal plane 1402.

Figure 15:
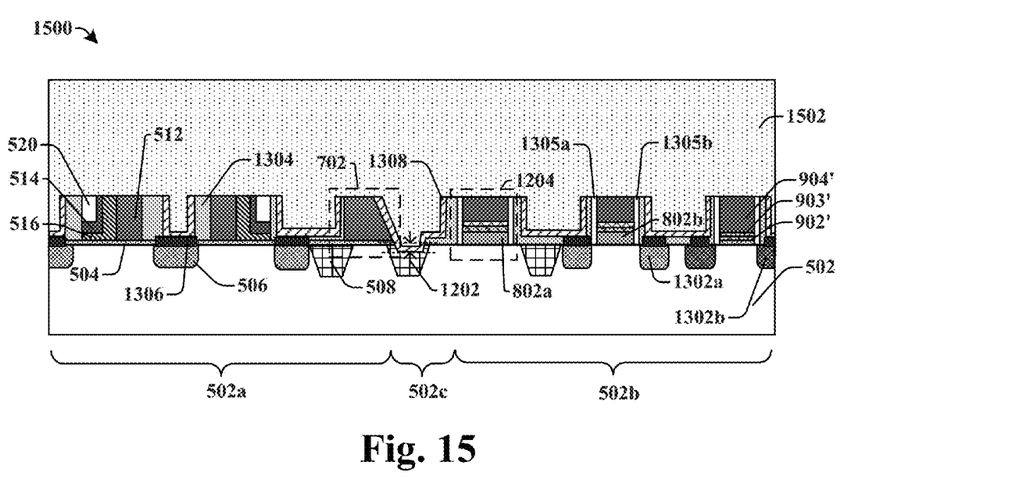

FIG. 15 illustrates a cross-sectional view of a semiconductor body 1500 corresponding to act 418. As shown in semiconductor body 1500, a first ILD layer 1502 is deposited over the semiconductor substrate 502 at a position that is laterally disposed between the dummy structures, 702 and 1204, and the HKMG transistors of the periphery region 502b and the split-gate memory cells of the embedded memory region 502a. In some embodiments, the first ILD layer 1502 comprises silicon oxide ($SiO_2$) or SiN (silicon nitride), for example.

Figure 16:
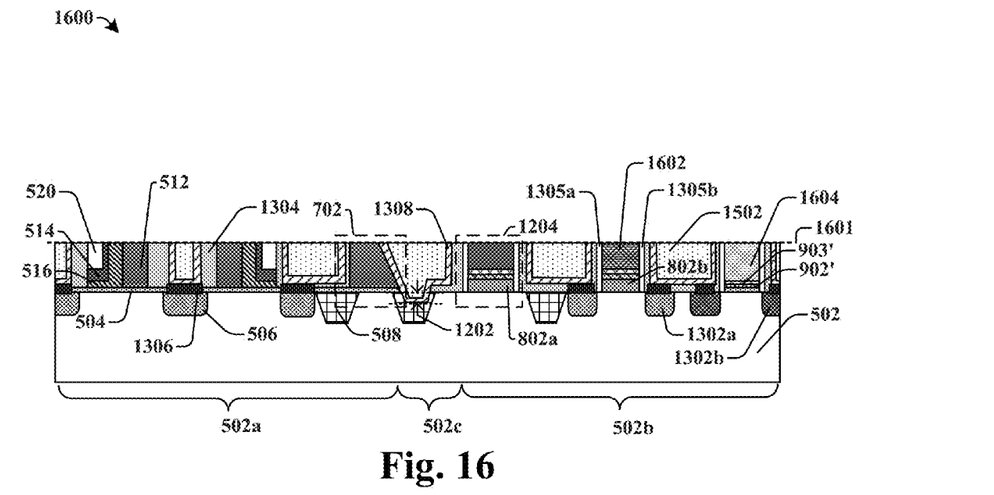

FIG. 16 illustrates a cross-sectional view of a semiconductor body 1600 corresponding to acts 420-422. As shown by semiconductor body 1600, a second CMP process is performed on the semiconductor body 1500 until the first ILD layer 1502 has been planarized along line 1601. A replacement gate (RPG) process is then performed. The replacement gate process may be performed by removing the sacrificial polysilicon layer 904 from an opening, and forming a replacement metal gate 1602 in the opening. Reference numeral 1602 represents an n-metal gate, making the corresponding transistor a HKMG NMOS transistor, while 1604 represents a p-metal gate, which makes the corresponding transistor a HKMG PMOS transistor. During the RPG process, a hard mask layer (not shown) covers the rest of the integrated circuit, during stripping/etching of the sacrificial polysilicon 904 as well as during deposition of the corresponding metal in the corresponding recesses. After the metals 1602 and 1604 are deposited, a third CMP process is performed to remove excess metal gate material and the hard mask layer.

Figure 17:
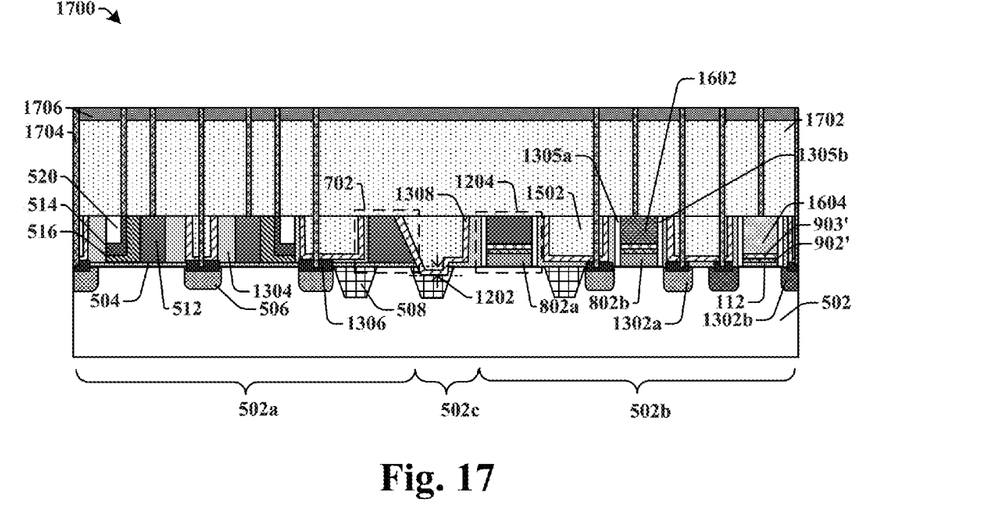

FIG. 17 illustrates a cross-sectional view of a semiconductor body 1700 corresponding to act 424. As shown by semiconductor body 1700, a second ILD layer 1702 is formed over the semiconductor body 1600 and metal contacts 1704 are formed within the second ILD layer 1702. Metal contacts 1704 extend downward to the silicide layer 1306 and to the top surfaces of the gate structures, and can comprise titanium (Ti), titanium nitride (TiN), or tungsten (W) in various embodiments. In some embodiments, a protective barrier layer 1706 may be formed over the second ILD layer 1702. In some embodiments, the protective barrier layer comprises BPTEOS (borophosphorous tetraethylorthosilicate) and the second ILD layer 1702 comprises SiN (silicon nitride).

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

The present disclosure relates to a structure and method for forming an integrated circuit having an embedded system with a periphery circuit having high-k metal gates, wherein the effects of CMP dishing are reduced.

In some embodiments, the present disclosure relates to an integrated circuit (IC) comprising a semiconductor substrate having a first region and a second region separated by a boundary region. A non-volatile memory (NVM) or a poly SiON (silicon oxy-nitride) CMOS device is disposed over the first region. A periphery circuit is disposed over the second region, and one or more dummy structures are laterally disposed between the first region and the second region.

In another embodiment, the present disclosure relates to an integrated circuit (IC) comprising a semiconductor substrate including an embedded memory region and a periphery region separated by a boundary region. A pair of split-gate flash memory cells are disposed over the embedded memory region, and a HKMG (high-k metal gate) logic circuit is disposed over the second region. An angled first dummy structure is positioned at a first end of the first region, and a second dummy structure is positioned at a second end of the second region.

In yet another embodiment, the present disclosure relates to a method of forming an integrated circuit (IC). The method comprises providing a semiconductor substrate having a first region and a second region laterally separated from the first region by a boundary region. The method further comprises forming a non-volatile memory (NVM) device over the first region. The method further comprises forming a first dummy structure at a position laterally disposed between the NVM device and the HKMG CMOS devices, and forming one or more HKMG (high-k metal gate) CMOS devices over the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
   a semiconductor substrate comprising a first region and a second region separated by a boundary region;
   a non-volatile memory (NVM) or a poly SiON (silicon oxy-nitride) CMOS device located over the first region;
   a periphery circuit disposed over the second region;
   one or more electrically inactive dummy structures laterally disposed between the NVM or the poly SiON CMOS device and the periphery circuit, wherein a bottom surface of the one or more electrically inactive dummy structures is disposed over a top surface of the semiconductor substrate; and
   a shallow trench isolation (STI) region comprising a first upper surface and a second upper surface that is recessed to a depth in comparison with the first upper surface to provide a recessed portion of the STI region, wherein the recessed portion of the STI region is laterally offset from the one or more electrically inactive dummy structures.

2. The IC of claim 1, wherein the one or more electrically inactive dummy structures comprise:
   a first dummy structure located at a first location overlying the first region, and laterally disposed between the NVM or poly SiON CMOS device and the boundary region; and
   a second dummy structure located at a second location overlying the second region, and laterally disposed between the periphery circuit and the boundary region.

3. The IC of claim 1, wherein the depth ranges between approximately 0 angstroms and approximately 200 angstroms.

4. The IC of claim 2, wherein the first dummy structure has an angled sidewall facing the boundary region, and a substantially vertical sidewall opposing the angled sidewall.

5. The IC of claim 2, wherein the second dummy structure comprises vertical sidewalls on both sides.

6. The IC of claim 2, further comprising:
   a second STI region disposed within the semiconductor substrate at a second position that is laterally located between the first dummy structure and the NVM or the poly SiON CMOS device.

7. The IC of claim 2, wherein the first dummy structure comprises a polysilicon gate overlying a SiON dielectric layer and the second dummy structure comprises a high-k metal gate overlying a base dielectric layer.

8. The IC of claim 1, wherein the first upper surface is substantially aligned with an upper surface of the semiconductor substrate; and
   wherein the recessed portion of the STI region has an angled sidewall.

9. The IC of claim 2, wherein the recessed portion of the STI region is arranged between the first dummy structure and the second dummy structure.

10. An integrated circuit (IC) comprising:
    a semiconductor substrate comprising an embedded memory region and a periphery region separated by a boundary region;
    a non-volatile memory (NVM) or a poly SiON (silicon oxy-nitride) CMOS device disposed over the embedded memory region;
    a periphery circuit disposed over the periphery region;
    an angled first dummy structure positioned at a first end of the embedded memory region; and
    a second dummy structure positioned at a second end of the periphery region.

11. The IC of claim 10, wherein the semiconductor substrate comprises a top surface within the boundary region that is recessed to a depth in comparison with top surfaces of the embedded memory and periphery regions.

12. The IC of claim 11, further comprising a high voltage (HV) HKMG transistor disposed over a HV dielectric layer on the periphery region.

13. The IC of claim 12, wherein the HV HKMG transistor comprises:
    a high-k dielectric layer disposed over the HV dielectric layer;
    an etch-stop layer disposed over the high-k dielectric layer; and
    a metal gate layer disposed over the etch-stop layer.

14. The IC of claim 13, wherein the embedded memory region comprises a pair of split-gate flash memory cells, respectively comprising:
- a select gate (SG);
- a memory gate (MG);
- a charge-trapping layer arranged between neighboring sidewalls of the MG and the SG, wherein the charge-trapping layer extends under the MG; and
- a sidewall spacer abutting an outer sidewall of the MG.

15. The IC of claim 14, wherein the pair of split-gate flash memory cells resides over a first dielectric layer and a second dielectric layer is laterally arranged between the pair of split-gate flash memory cells.

16. The IC of claim 15, further comprising:
- a plurality of source/drain regions disposed within the semiconductor substrate;
- a silicide layer located over the source/drain regions;
- a contact etch-stop layer (CESL) disposed over the silicide layer; and
- metal contacts extending from the silicide layer to an overlying metal interconnect layer.

17. The IC of claim 16, wherein:
the semiconductor substrate comprises silicon;
the SG and the MG comprise polysilicon or metal;
the first dielectric layer comprises SiON (silicon oxynitride), SiO$_2$ (silicon dioxide), or SiN (silicon nitride);
the second dielectric layer comprises SiON, SiO2, or SiN;
the sidewall spacer comprises SiON, SiO2, or SiN; and
the high-k dielectric layer comprises HfO (hafnium oxide), HfSiO (hafnium silicon oxide), HfAlO (hafnium aluminum oxide), or HfTaO (hafnium tantalum oxide).

18. A method of forming an integrated circuit (IC), comprising:
providing a semiconductor substrate comprising a first region and a second region laterally separated from the first region by a boundary region;
forming a non-volatile memory (NVM) device over the first region;
forming one or more HKMG (high-k metal gate) CMOS devices over the second region; and
forming a first dummy structure at a position laterally disposed between the NVM device and the one or more HKMG CMOS devices;
forming a second dummy structure at a position laterally disposed between the first dummy structure and the HKMG CMOS devices.

19. The method of claim 18, wherein the first dummy structure has an angled sidewall facing the boundary region, and a substantially vertical sidewall opposing the angled sidewall.

* * * * *